United States Patent
Pareek et al.

(10) Patent No.: US 11,118,263 B2
(45) Date of Patent: Sep. 14, 2021

(54) METHOD FOR FORMING A PROTECTIVE COATING FILM FOR HALIDE PLASMA RESISTANCE

(71) Applicants: Applied Materials, Inc., Santa Clara, CA (US); University of California, San Diego, La Jolla, CA (US)

(72) Inventors: Yogita Pareek, San Jose, CA (US); Kevin A. Papke, Portland, OR (US); Emily Sierra Thomson, La Jolla, CA (US); Mahmut Sami Kavrik, Santa Barbara, CA (US); Andrew C. Kummel, San Diego, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 88 days.

(21) Appl. No.: 16/408,809

(22) Filed: May 10, 2019

(65) Prior Publication Data

US 2020/0354833 A1 Nov. 12, 2020

(51) Int. Cl.
| | |
|---|---|
| C23C 16/02 | (2006.01) |
| C23C 16/40 | (2006.01) |
| C23C 16/455 | (2006.01) |
| C23C 16/50 | (2006.01) |
| C23C 16/56 | (2006.01) |
| C23C 16/20 | (2006.01) |
| C23C 16/34 | (2006.01) |

(52) U.S. Cl.
CPC .... *C23C 16/45536* (2013.01); *C23C 16/0272* (2013.01); *C23C 16/0281* (2013.01); *C23C 16/20* (2013.01); *C23C 16/34* (2013.01); *C23C 16/403* (2013.01); *C23C 16/45529* (2013.01); *C23C 16/50* (2013.01); *C23C 16/56* (2013.01); *C23C 16/45555* (2013.01)

(58) Field of Classification Search
None
See application file for complete search history.

(56) References Cited

U.S. PATENT DOCUMENTS

| | | | |
|---|---|---|---|
| 2013/0059077 A1* | 3/2013 | Thompson | C23C 16/18 427/250 |
| 2018/0016678 A1* | 1/2018 | Fenwick | C23C 16/34 |
| 2018/0327899 A1* | 11/2018 | Wu | C23C 16/403 |

FOREIGN PATENT DOCUMENTS

WO WO-2016131024 A1 * 8/2016 ......... C23C 16/4412

OTHER PUBLICATIONS

Vargel, C. Corrosion of Aluminum. (Elsevier, 2004).
Konings, R. J. M. et al. The Thermodynamic Properties of the f-Elements and their Compounds: Part 2. The Lanthanide and Actinide Oxides J. Phys. Chem. Ref. Data 43, (2014).
Ramos, R., Cunge, G., Pelissier, B. & Joubert, O. Cleaning Aluminum Fluoride Coatings from Plasma Reactor Walls in SiCl 4/Cl2 plasmas Plasma Sources Sci. Technol. 16, 711-715 (2007).

(Continued)

*Primary Examiner* — Jose I Hernandez-Kenney
(74) *Attorney, Agent, or Firm* — Patterson + Sheridan LLP

(57) ABSTRACT

A method of forming a protective coating film for halide plasma resistance includes depositing a seed layer on a surface of an article via an atomic layer deposition (ALD) process, depositing a rare-earth containing oxide layer on the seed layer via an ALD process, and exposing the rare-earth containing oxide layer to fluorine-containing plasma.

7 Claims, 4 Drawing Sheets

(56) References Cited

OTHER PUBLICATIONS

Mar, R. W. The Vapor Pressure, Heat of Sublimation, and Evaporation Coefficient of Lanthanum Fluoride. J. Phys. Chem. 71, 888-894 (1967).
Parkinson, R. Properties and Applications of Electroless Nickel. Nickel Dev. Inst. 1-33 (1997). doi:10.4137/ASWR. S12153.
Rose, I. & Whittington, C. Nickel Plating Handbook. (Nickel Institute, 2014).
Kim, D. M. et al. Relative Sputtering Rates of Oxides and Fluorides of Aluminum and Yttrium. Surf. Coatings Technol. 309, 694-697 (2017).
Lin, T.-K., Wang, W.-K., Huang, S.-Y., Tasi, C.-T. & Wuu, D.-S. Comparison of Erosion Behavior and Particle Contamination in Mass-Production CF4/O2 Plasma Chambers Using Y2O3 and YF3 Protective Coatings. Nanomaterials 7, 183 (2017).
Donnelly, V. M., Flamm, D. L., Dautremont?Smith, W. C. & Werder, D. J. Anisotropic etching of SiO 2 in low frequency CF 4 /O 2 and NF 3 /Ar plasmas. J. Appl. Phys. 55, 242-252 (1984).
Sigmund, p. 2 . Sputtering by Ion Bombardment: Theoretical Concepts 2 . 1 Introductory and Historical Survey.
Cao, Y. C. et al. Plasma etching behavior of Y2O3ceramics: Comparative study with Al2O3. Appl. Surf. Sci. 366, 304-309 (2016).

\* cited by examiner

METHOD FOR FORMING A PROTECTIVE COATING FILM FOR HALIDE PLASMA RESISTANCE

BACKGROUND

Field

Embodiments disclosed herein generally relate to manufacturing a protective coating film on a processing chamber component resistive to plasma environment utilized in a semiconductor plasma processing chamber. More specifically, embodiments disclosed herein relate to form a rare-earth containing oxide layer on an aluminum chamber component for protection from contaminations, corrosions, and/or erosions in the plasma environment.

Description of the Related Art

Semiconductor processing chambers are often exposed to harsh process conditions such as halogen containing plasma (such as $NF_3$, $TiCl_4$, $CF_4$, and $Cl_2$), high temperatures, and combinations thereof. These harsh process conditions may lead to contaminations, corrosions, and/or erosions of chamber components. For reducing such contaminations, corrosions, and erosions, protective coating films are deposited on chamber components, conventionally by physical vapor deposition (PVD), chemical vapor deposition (CVD), sputtering, thermal spray, plasma spraying, aerosol deposition, ion assisted deposition, and the like. Typically, chamber components are made of aluminum due to high thermal conductivity, high machinability, and lower cost compared with stainless steel, and protective coating films are formed of rare earth metal-containing oxide, commonly yttrium-containing oxide, plasma-sprayed over anodized surfaces of aluminum chamber components.

However, these conventional methods are unable to conformally coat chamber components, especially in areas having features with high aspect ratios (e.g., small holes or plenums in showerheads). Furthermore, anodized surfaces of aluminum chamber components tend to have pores, through which halogen atoms, reactive molecules, ions, and/or radicals can diffuse into the chamber components when exposed to halogen containing plasma. Spray coated rare earth metal-containing oxides also contain pores of between about 0.01 µm and about 10 about µm. This diffusion leads to contaminations in the chamber components.

Therefore, there is a need for optimized materials, structures, and methods for conformally depositing protective coating films on topologically complex surfaces of chamber components, having good plasma resistance performance in terms of adequate mechanical, electrical and thermal properties, reduced metal contamination, and prolonged component life. This translates to low costs of manufacturing, reduced wafer defects, increased lifetime, and increased mean time between cleanings.

SUMMARY

Embodiments described herein generally related to a protective coating film for halide plasma resistance. In one embodiment, a method of forming a protective coating film for halide plasma resistance includes depositing a seed layer on a surface of an article via an atomic layer deposition (ALD) process, depositing a rare-earth containing oxide layer on the seed layer via an ALD process, and exposing the rare-earth containing oxide layer to fluorine-containing plasma.

In another embodiment, a method of forming a protective coating film for halide plasma resistance includes cleaning a surface of an article to be coated with a protective coating film, depositing a seed layer on the surface of the article disposed via an atomic layer deposition (ALD) process, depositing a rare-earth containing oxide layer on the seed layer within via an ALD process, exposing the rare-earth containing oxide layer to fluorine-containing plasma, and depositing a diffusion barrier layer prior to depositing the rare-earth containing oxide layer.

In another embodiment, a protective coating film for halide plasma resistance is disclosed herein. The protective coating film includes a seed layer formed on a surface of an article, a rare-earth containing oxide layer on the seed layer, and a top layer on the rare-earth containing oxide layer, wherein the top layer includes crystallites of a rare-earth containing fluoride.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments described herein enable conformal and uniform coating of surfaces of chamber components with a protective coating film that is resistant to halogen containing plasma. A protective coating film includes a seed layer (e.g., amorphous aluminum oxide, $Al_2O_3$) and a rare earth metal-containing oxide (e.g., amorphous lanthanum-containing oxide or hafnium-containing oxide) layer. The rare earth metal-containing oxide layer includes crystallites of the rare earth metal-containing fluoride (e.g., lanthanum-containing fluoride or hafnium-containing fluoride) formed by exposure to fluorine containing plasma. The protective coating film may further include a diffusion barrier (e.g., amorphous nickel (Ni), titanium nitride (TiN), tantalum nitride (TaN)). As used herein, the term plasma resistant means resistant to plasma as well as chemistry and radicals. The chamber components may be an aluminum (e.g., Al 6061) or stainless steel. In the methods described herein, each layer of the protective coating film is deposited by an atomic layer deposition (ALD) process. In contrast to conventional deposition methods, the ALD deposition processes disclosed herein result in conformal and complete deposition of a protective coating film over topologically complex surfaces of chamber components, such as orifices, plenums, or other small features. The more complete coverage results in increased protection of the chamber components, particularly in plasma environments often used in the processing of semiconductor materials. Furthermore, the rare earth metal-containing oxide layer including crystallites of the rare earth metal-containing fluoride and the additional diffusion barrier prevent halogen ions from reaching the chamber components, thus contaminations of the chamber components may be reduced.

Examples of chamber components (e.g., semiconductor process chamber components) include showerheads, faceplates, gas distributors, and other equipment which may have a plurality of gas passages formed therein, made of aluminum such as Al 6061 and Al 6063. The other equipment includes but is not limited to a substrate support assembly, an electrostatic chuck (ESC), a ring (e.g., a process kit ring or single ring), a chamber wall, a base, plasma electrodes, a plasma housing, a nozzle, a lid, a liner, a liner kit, a shield, a plasma screen, a flow equalizer, a cooling base, a chamber viewport, a chamber lid, and a diffuser.

Figure 1A:
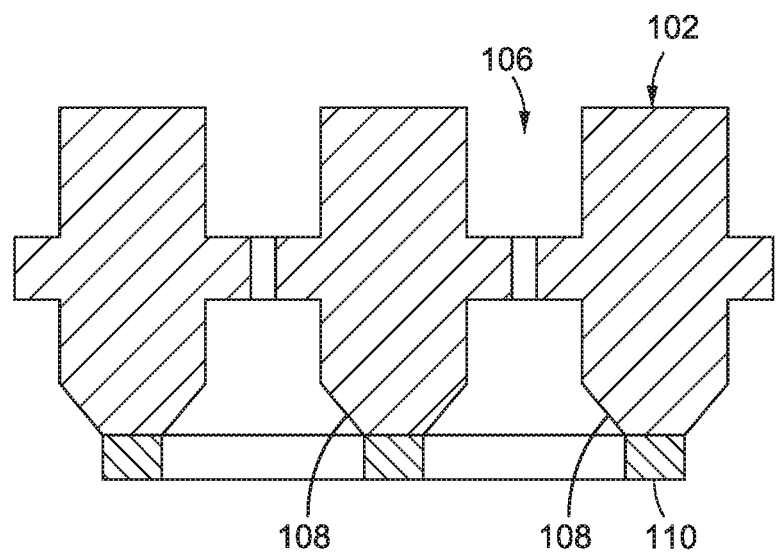
FIGS. 1A and 1B respectively illustrate partial schematic sectional views of a showerhead and a faceplate coated using conventional methods.
Figure 1B:
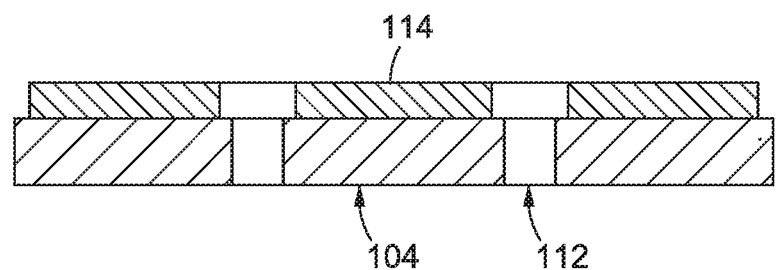

FIGS. 1A and 1B respectively illustrate partial schematic sectional views of a showerhead 102 and a faceplate 104 coated using conventional methods, such as thermal spraying or e-beam deposition. In the example shown in FIG. 1A, a showerhead 102 is formed from aluminum and includes a plurality of plenums 106 formed therein (two are shown). The plenums 106 may optionally include beveled edges 108 at one end thereof. Using conventional coating methods, the beveled edges 108 are not coated with a protective coating film 110 due to limitations of conventional coating methods. For example, the conventional methods are unable to adequately coat surfaces near plenums 106 due to the directional deposition nature of the conventional deposition process, thus leaving the beveled edges 108 unprotected. The unprotected surfaces are easily degraded when exposed to plasma, thus introducing undesired particulate matter within a process region. FIG. 1B illustrates an example of a faceplate 104 including plenums 112 having a protective coating film 114 deposited thereon. Similar to the showerhead 102 described above, the conventional methods are unable to adequately coat the faceplate 104, particularly the plenums 112. While upper surfaces of the faceplate 104 may be coated, the interior surfaces of the plenums 112 remain uncoated. The uncoated surfaces contribute to contamination within a process chamber due to undesired interaction with plasmas.

Figure 2A:
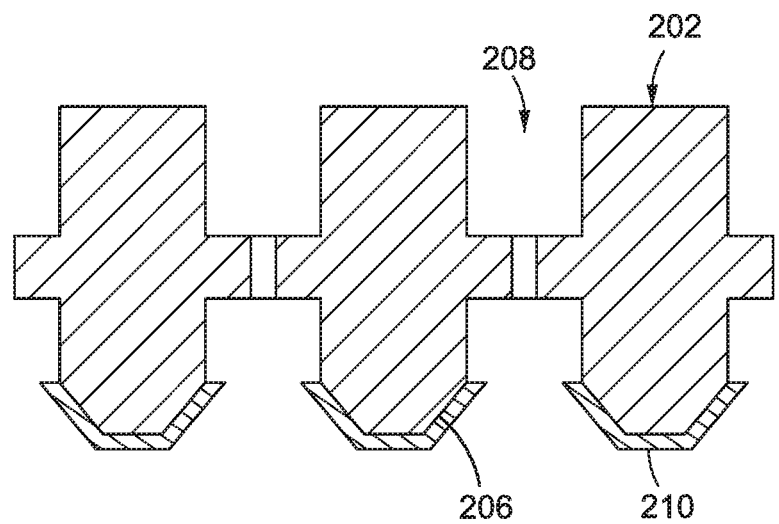
FIGS. 2A and 2B respectively illustrate partial sectional views of a showerhead and a faceplate 204 coated using a method according to one embodiment.
Figure 2B:
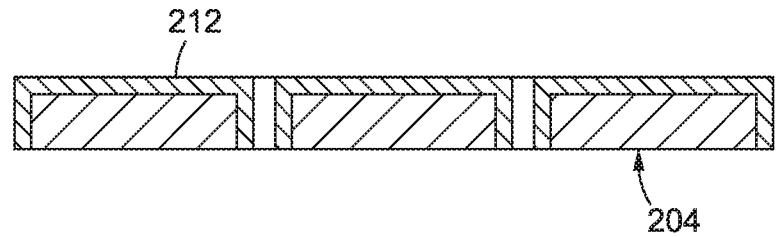

FIGS. 2A and 2B respectively illustrate partial sectional views of a showerhead 202 and a faceplate 204 coated using the methods described herein. The coating methods by the ALD processes described herein result in improved conformal coating of mechanical components, particularly those including orifices, holes, plenums, and the like. Referring to FIG. 2A, the showerhead 202 includes improved coating coverage of bevels 206 of plenums 208 compared to the conventional methods. Using methods described herein, the ALD processes result in complete and uniform deposition of protective coating films 210, 212 over all exposed surfaces of chamber components.

Figure 3:
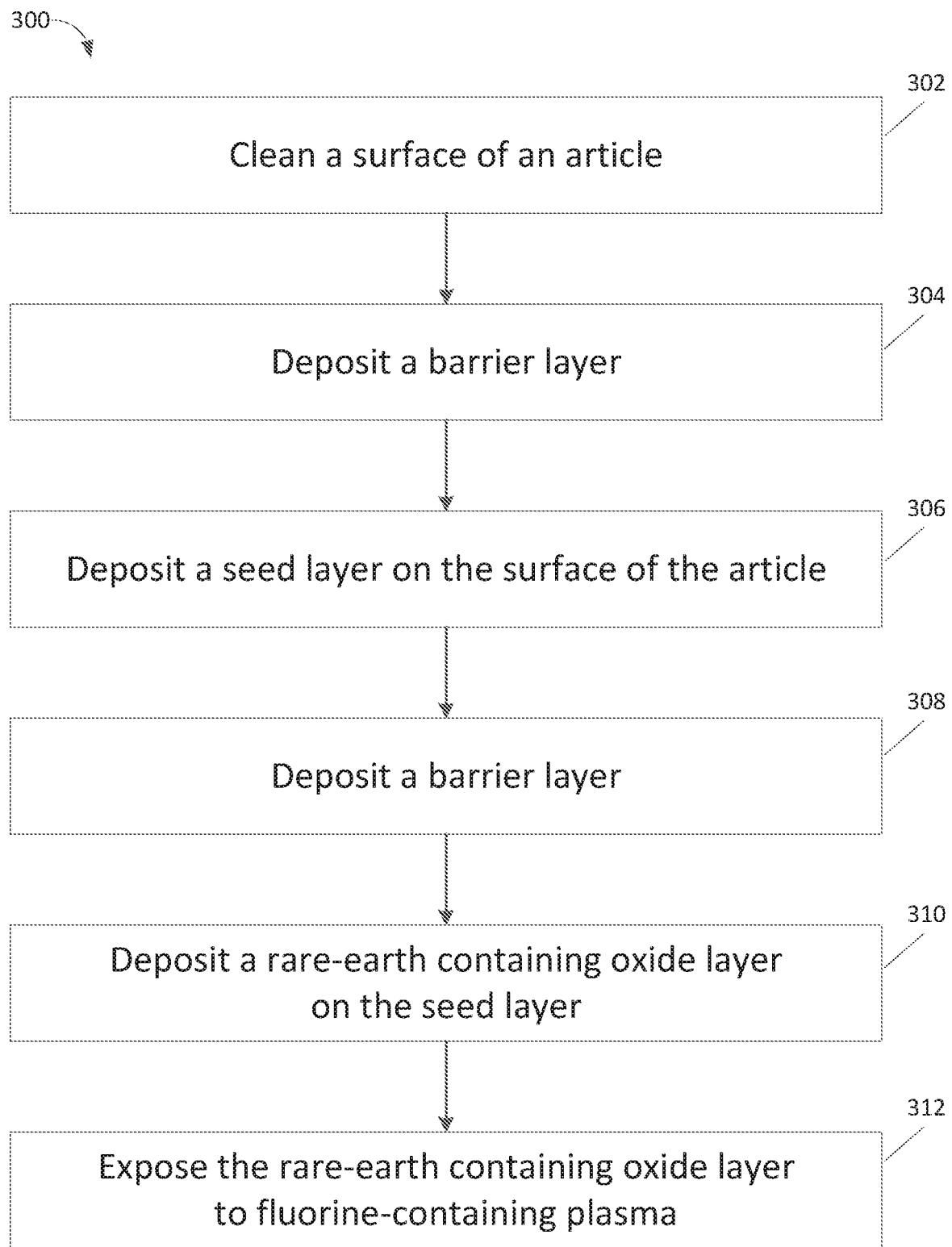
FIG. 3 depicts a process of forming a protective coating film on a surface of an article with an ALD method according to one embodiment.

FIG. 3 depicts a process 300 of forming a protective coating film on a surface of an article with an ALD method according to one embodiment. FIGS. 4A, 4B, 4C, 4D, and 4E are schematic side views of portions of a protective coating film 402 formed on an article 404 during at least one of the intermediate method steps illustrated in FIG. 3. Although the method steps illustrated in FIG. 3 are described sequentially, persons skilled in the art will understand that other process sequences that include one or more method steps that have been omitted and/or added, and/or has been rearranged in another desirable order, will fall within the scope of the embodiments of the disclosure provided herein.

In FIGS. 4A, 4B, 4C, 4D, and 4E, the article 404 that includes a plurality of trenches 406 formed therein (two are shown) is shown as a possible example. In the example embodiments described herein, the article 404 is made from aluminum such as Al 6061. It should be noted, that the particular embodiments explained below are some possible examples of an article that is coated with a protective coating film according to the present disclosure and do not limit the possible configurations, materials, or the like of articles to be coated according to the present disclosure. For example, the article 404 may be made from stainless steel. In some embodiments, the article 404 is a wafer or a substrate, such as a crystalline silicon wafer, used for fabrication in integrated circuits such as metal-oxide-semiconductor field-effect transistors (MOSFET).

Figure 4A:
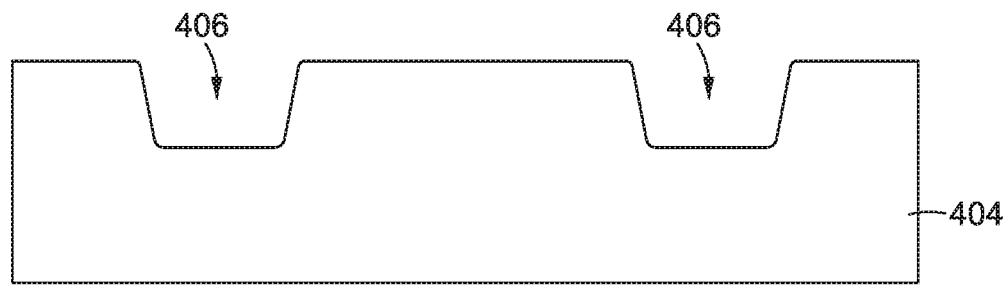
FIGS. 4A, 4B, 4C, 4D, and 4E are schematic side views of portions of a protective coating film formed on an article during at least one of the intermediate method steps illustrated in FIG. 3.

In block 302 of FIG. 3, a surface 408 of the article 404 as shown in FIG. 4A is cleaned and prepared for an ALD deposition. The surface 408 of the article 404 may be degreased and dried. In some embodiments, the surface 408 of the article 404 is rinsed with a solvent, such as methanol, acetone, isopropylalcohol (IPA), deionized (DI) water, or the like for about 20 seconds. The surface 408 of the article 404 may be dried with nitrogen ($N_2$) gas. Further, native oxides and trace metal impurities on the surface 408 of the article 404 due to machining of the surface 408 may be cleaned with a cleaning solution (i.e. wet etch). In some embodiments, the cleaning solution is a mixed solution of hydrofluoric acid (HF) and nitric acid ($HNO_3$). The wet etch process may create pits in the surface 408 of the article 404, for example, 60 nm deep, while removing machining lines on the surface 408 of the article 404. Following the cleaning process with the cleaning solution described above, the article 404 may further be rinsed in DI water for several seconds, to remove any leftover chemicals (e.g., acids or bases) used to remove any unwanted contaminants from the surface of the part. In some embodiments, this rinsing process may be omitted.

In block 304 of FIG. 3, a diffusion barrier 416 is deposited directly on the surface 408 of the article 404 by an ALD process in some embodiments. In some embodiments, the diffusion barrier 416 is made of amorphous nickel (Ni), titanium nitride (TiN), tantalum nitride (TaN), or the like. The diffusion barrier 416 may prevent halogen ions from reaching the surface 408 of the article 404. An ALD deposited Ni layer may be amorphous and prevent the diffusion of halogen ions more effectively than a polycrystalline Ni layer as grain boundaries in polycrystalline Ni likely provides diffusion paths for halogen ions.

Figure 4B:
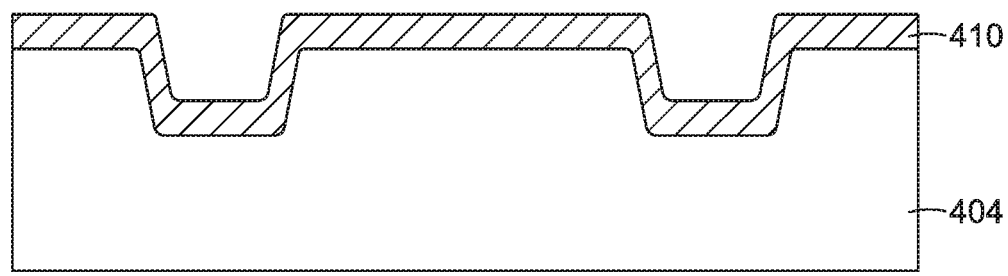

In block 306 of FIG. 3, a seed layer 410 is deposited on the surface 408 of the article 404 in an ALD chamber as shown in FIG. 4B. In some embodiments, the deposition process is performed in a commercial, hot walled, and cross flow ALD chamber, such as Beneq® TFS 200 ALD. In an ALD process, the surface 408 of the article 404 is exposed to two or more gaseous chemical precursors that are inserted as a series of sequential and non-overlapping pulses. In each of these pulses, the precursor chemically reacts with the surface 408 of the article 404 in a self-limiting way, such that the reaction terminates once all the reactive sites on the surface 408 of the article 404 are consumed. The amount of material deposited on the surface 408 after each of these pulses is determined by the nature of the precursor-surface interaction. The remaining precursor is pumped out of the ALD chamber. By varying the number of cycles (referred to as ALD cycles) of these pulses of alternate gaseous chemical precursors, it is possible to grow materials uniformly and with high precision on complex surfaces of chamber components.

In some embodiments, the article 404 is made of aluminum and the seed layer 410 is made of aluminum oxide ($Al_2O_3$). The surface 408 of the article 404 may be exposed to gaseous trimethyl-aluminum (TMA, $(Al(CH_3)_3)_2$) and water ($H_2O$) in the ALD chamber at a temperature between room temperature and about 350° C. During the exposure, TMA reacts with a finite number of reactive sites on the surface 408 of the article 404 (aluminum), forming trimethylaluminium ($AlCH_3$). Once TMA absorbs on all those reactive sites, the forming of the trimethylaluminium ($AlCH_3$) on the surface 408 of the article 404 stops. Gaseous TMA exists in forms of dimers (($Al(CH_3)_3$)—($Al(CH_3)_3$)), and is highly reactive, providing a superior nucleation even on surfaces having complex structures. The remaining TMA may be purged out of the ALD chamber. The surface 408 of the article 404 is then exposed to water ($H_2O$) vapor, which replaces the methyl group (—$CH_3$) on the surface 408 with the hydroxyl group (—OH) and forms methane ($CH_4$) as a reaction byproduct. This cycle of sequential exposures to TMA and water (e.g., introducing TMA, purging TMA, introducing water, and purging) may be repeated, adding to the thickness by one or a few atomic layers of aluminum oxide ($Al_2O_3$). In some embodiments, the ALD cycle is repeated about 50 cycles, and an amorphous aluminum oxide ($Al_2O_3$) layer having a thickness of between about 8 nm and about 20 nm, for example, about 5 nm, is formed.

In some embodiments, the surface 408 of the article 404 is exposed to hydrazine ($N_2H_4$) and hydrogen peroxide (HOOH) that are extremely reactive, and an oxide layer (i.e. the seed layer 410) is formed on the surface 408 of the article 404. The formed oxide layer may have a thickness between about 2 nm and about 50 nm, for example 5 nm.

In some embodiments, the seed layer 410 of aluminum oxide ($Al_2O_3$) is formed by traditional anodization methods. The formed aluminum oxide layer may have a thickness about 10-50 μm.

Figure 4C:
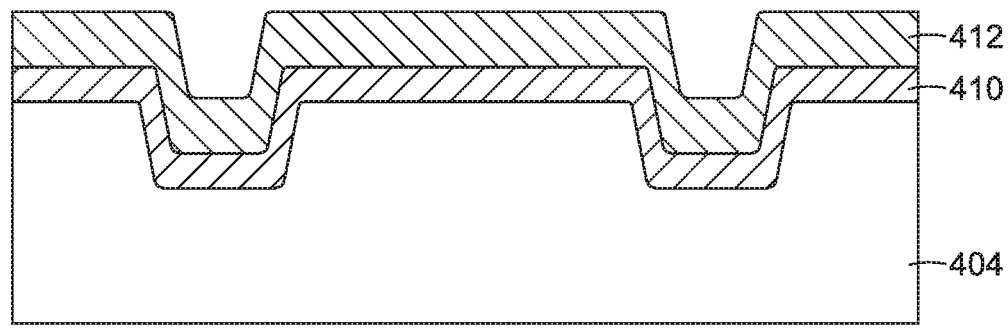
Figure 4D:
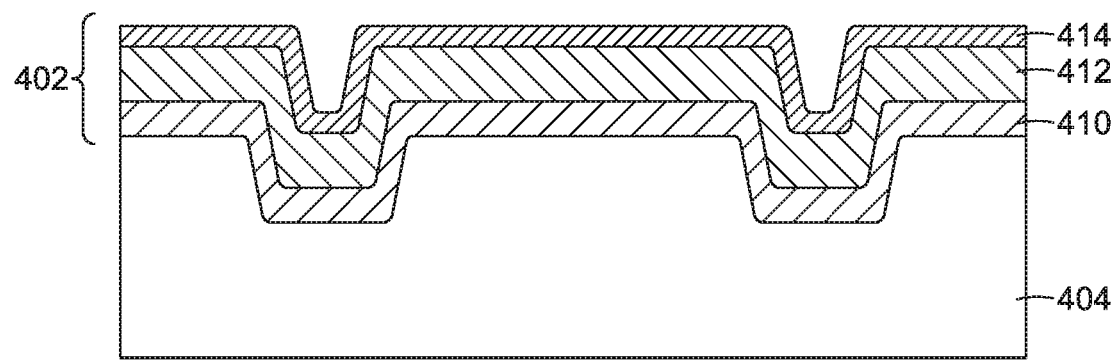
Figure 4E:
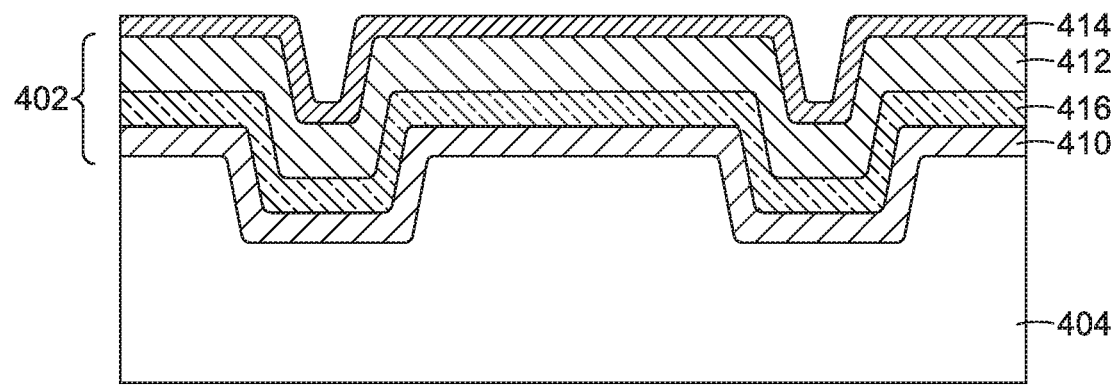

In block 308 of FIG. 3, a diffusion barrier 416 is deposited on the seed layer 410 and as shown in FIG. 4E, in some embodiments, by another ALD process. In some embodiments, the additional diffusion barrier 416 is made of amorphous nickel (Ni), titanium nitride (TiN), tantalum nitride (TaN), or the like. The additional diffusion barrier 416 may prevent halogen ions from reaching the surface 408 of the article 404. An ALD deposited Ni layer may be amorphous and prevent the diffusion of halogen ions more effectively than a polycrystalline Ni layer as grain boundaries in polycrystalline Ni likely provides diffusion paths for halogen ions.

In block 310 of FIG. 3, a rare-earth containing oxide layer 412 is disposed on the seed layer 410 as shown in FIG. 4C by another ALD process, by exposing the seed layer 410 formed on the surface 408 of the article 404 to a rare-earth containing precursor in the ALD chamber. The seed layer 410 (e.g., amorphous aluminum oxide, $Al_2O_3$) may act as a glue layer between the article 404 (e.g., aluminum) and the rare-earth containing oxide layer 412 due to adhesion via common elements (e.g., aluminum with the article 404, oxygen with the rare-earth containing oxide layer 412), and thus reduce defects at an interface between the article 404 and the rare-earth containing oxide layer 412. Furthermore, amorphous aluminum oxide ($Al_2O_3$) typically has a higher thermal expansion coefficient than a rare-earth containing oxide. Thus, an amorphous $Al_2O_3$ layer may also act as a stress relief layer to relieve stress at the interface between the article 404 and the rare-earth containing oxide layer 412 at high temperatures due to a significantly higher thermal expansion coefficient of a metal (e.g., aluminum) than the coefficient of thermal expansion of a rare-earth containing oxide, and thus prevent cracking of the protective coating film 402 at temperatures up to about 200° C., about 250° C., or about 350° C.

In some embodiments, the rare-earth containing oxide is lanthanum oxide ($La_2O_3$) and the rare-earth containing precursor is tris(N,N'-diisopropylformamidinato) lanthanum La('PrfAMD)$_3$ pulsed along with ozone. In some embodiments, the rare-earth containing oxide is hafnium dioxide ($HfO_2$) and the rare-earth containing precursor is tetrakis (dimethylamido) hafnium (TDMAH) pulse along with water ($H_2O$) vapor.

Conventionally, yttrium oxide has been used to form a protective coating film for aluminum chamber components due to the high thermodynamic stability of both yttrium oxide and yttrium fluoride. However, it has been shown that an etch rate of yttrium oxide ($Y_2O_3$) is four times slower than that of aluminum oxide ($Al_2O_3$) in 95% $CF_4$ plasma at room temperature. It has been also shown that a sputtering rate of yttrium fluoride ($YF_3$) is roughly three times slower than that of aluminum fluoride ($AlF_3$) when bombarded with Ar ions at 1 kV and that sputtering rates of aluminum oxide ($Al_2O_3$) and yttrium oxide ($Y_2O_3$) are 3 to 10 times slower than their respective fluorides. In the example embodiments described herein, lanthanum oxide ($La_2O_3$) and hafnium dioxide ($HfO_2$) are shown as examples of the rare-earth containing oxide layer 412 that may provide higher etch rates, for example, in a commercially reactive ion etching/ inductively couple plasma dry etcher. It should be noted that these particular examples do not limit the possible materials or the like of the rare-earth containing oxide layer 412. In some embodiments, the rare-earth containing oxide may be $ZrO_2$, or $Y_2O_3$.

In some embodiments, the formed rare-earth containing oxide layer 412 has a thickness between about 5 nm and about 200 nm, for example, 20 nm. A ratio of a thickness of the rare-earth containing oxide layer 412 to a thickness to the seed layer 410 may be 100:1. A higher ratio of the thickness of the rare-earth containing oxide layer 412 to the thickness to the seed layer 410 (e.g., 200:1, 100:1, 50:1, 20:1, 10:1, 5:1, 2:1) provides better corrosion and erosion resistance, while a lower ratio of the thickness of the rare-earth containing oxide layer 412 to the thickness to the seed layer 410 (e.g., 1:2, 1:5, 1:10, 1:20, 1:50, 1:100, 1:200) provides better heat resistance (e.g., resistance to cracking). The thickness ratio may be selected in accordance with specific chamber applications.

In block 312 of FIG. 3, the rare-earth containing oxide layer 412 is exposed to fluorine-containing plasma such as $CF_4$ or $NF_3$ plasma in an etch chamber such as reactive-ion etching (RIE) chamber. In some embodiments, the RIE chamber is maintained at a pressure about 200 mTorr and at a temperature about 150° C., and a field of $CF_4$ plasma is set to be applied at 150 W. After the plasma exposure, for example, for 10 hours or 30 hours, the rare-earth containing oxide layer 412 is partially fluorinated and a top layer 414 containing the rare-earth containing fluoride is formed at a surface of the rare-earth containing oxide layer 412 that was exposed to the plasma as shown in FIG. 4D. The top layer 414 may have a polycrystalline structure, including crystallites of the rare-earth containing fluoride in the matrix of the amorphous rare-earth containing oxide. In some embodiments, the rare-earth containing oxide is lanthanum oxide ($La_2O_3$) and the rare-earth containing fluoride is lanthanum fluoride ($LaF_3$), in which the oxygen sites of lanthanum oxide ($La_2O_3$) have been replaced with fluorine atoms and lanthanum fluoride ($LaF_3$) have been crystallized. In the top layer 414, the crystallites of the rare-earth containing fluoride (e.g., $LaF_3$) have expanded in volumes within the matrix of amorphous rare-earth containing oxide (e.g., $La_2O_3$) due to differences in the lattice constants, and grain boundaries of the crystallites are compact, thus closing pores in the matrix of amorphous rare-earth containing oxide. For example, lanthanum fluoride ($LaF_3$) is in the Rhombohedral crystal structure having lattice constants a=7.2 Å and c=7.4 Å, whereas lanthanum oxide ($La_2O_3$) is in the Hexagonal crystal structure having lattice constants a=4.8 Å and c=13 Å. Thus, the top 414 may prevent halogen ions from reaching the surface 408 of the article 404.

For example, it has been shown that in an amorphous lanthanum oxide ($La_2O_3$) formed according to the methods described herein an average ratio of a number of oxygen sites to a number of lanthanum sites is reduced from 2.45 to 1.95 (equivalently about 20% of the oxygen sites have been replaced with fluorine atoms) after plasma exposure for 10 hours, and to 1.74 (equivalently about 29% of the oxygen sites have been replaced with fluorine atoms) after plasma exposure for 30 hours. A thickness of the top layer 414 increases by about 10.7 nm after the plasma exposure for 10 hours, and by about 18.2 nm after the plasma exposure for 30 hours. The increase in the thickness of the top layer 414 may be due to addition of fluorine atoms on the exposed surface of the top layer 414.

In some embodiments, the top layer 414 has a thickness of 50 nm, and includes crystallites of lanthanum fluoride ($LaF_3$) in an amorphous lanthanum oxide ($La_2O_3$) after an exposure to $CF_4$ plasma for between about 3 hours and about 13 hours.

In the top layer 414, the rare-earth containing fluoride exits in crystallites in a thermodynamically stable state. Thus, the protective coating film 402 including the top layer 414 may provide increased protection of the article 404 in plasma environments.

Benefits of the embodiments described in this disclosure include more complete deposition of protective coating films on topologically complex surfaces of chamber components. In contrast to conventional deposition methods, the ALD deposition methods disclosed herein result in improved coverage of the surfaces of chamber components near orifices, plenums, or other small features and thus improved protection of the chamber components from corrosion and erosion when exposed to halogen containing plasma. Protective coating films disclosed herein may also prevent diffusions of halogen atoms, reactive molecules, ions, and/or radicals into chamber components, and thus contaminations of the chamber components are reduced.

While the foregoing is directed to specific embodiments, other and further embodiments may be devised without departing from the basic scope thereof, and the scope thereof is determined by the claims that follow.

What is claimed is:

1. A method of forming a protective coating film for halide plasma resistance, comprising:
   depositing a seed layer on a surface of an article via an atomic layer deposition (ALD) process;
   depositing a rare-earth containing oxide layer on the seed layer via an ALD process; and
   exposing the rare-earth containing oxide layer to fluorine-containing plasma via an ALD process, wherein the seed layer consists of aluminum oxide, the rare-earth layer containing oxide layer consists of lanthanum oxide ($La_2O_3$), and wherein the article comprises an aluminum chamber component.

2. The method according to claim 1, wherein
   the seed layer comprises amorphous aluminum oxide, and the depositing of the seed layer includes:
   exposing the surface of the article to gaseous trimethylaluminum (TMA); and
   exposing the surface of the article to water vapor.

3. The method according to claim 1, wherein
   the depositing of the rare-earth containing oxide layer includes exposing the seed layer to tris(N,N'-diisopropylformamidinato) lanthanum La('PrfAMD)$_3$ and ozone.

4. The method according to claim 1, wherein the rare-earth containing oxide layer is exposed to the fluorine-containing plasma for between 3 hours and 10 hours in a reactive-ion etching (RIE) chamber that is maintained at a pressure 200 mTorr and at a temperature 150° C. and is configured to apply a field of the fluorine-containing plasma at 150 W.

5. A method of forming a protective coating film for halide plasma resistance, comprising:
   depositing a seed layer on a surface of an article via an atomic layer deposition (ALD) process;
   depositing a rare-earth containing oxide layer on via an ALD process;
   exposing the rare-earth containing oxide layer to fluorine-containing plasma; and
   depositing a diffusion barrier layer prior to depositing the rare-earth containing oxide layer, wherein the seed layer consists of aluminum oxide, the rare-earth layer containing oxide layer consists of lanthanum oxide ($La_2O_3$), and wherein the article comprises an aluminum chamber component.

6. The method according to claim 5, wherein
   the seed layer comprises amorphous aluminum oxide, and the depositing of the seed layer includes:
   exposing the surface of the article to gaseous trimethylaluminum (TMA); and
   exposing the surface of the article to water vapor.

7. The method according to claim 5, wherein the diffusion barrier layer is deposited on the seed layer and comprises a material selected from the group consisting of amorphous nickel (Ni), titanium nitride (TiN), and tantalum nitride (TaN).

* * * * *